Figure 1:
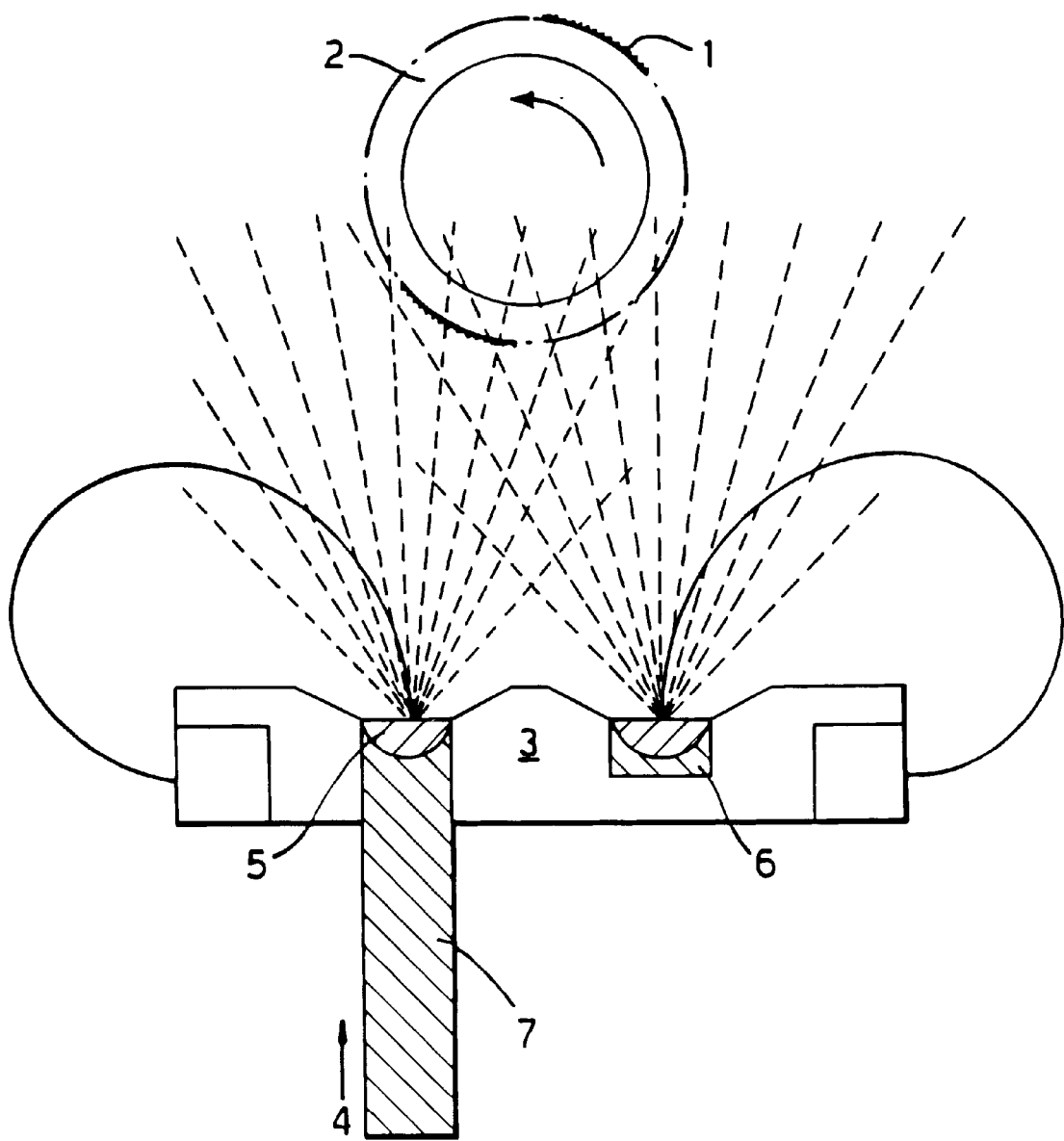

United States Patent [19]
Ward-Close et al.

[11] Patent Number: 5,922,460
[45] Date of Patent: Jul. 13, 1999

[54] COMPOSITE MATERIALS

[75] Inventors: Charles M. Ward-Close, Hampshire, United Kingdom; Francis H. Froes; Deepak Upadhyaya, both of Moscow, Id.; Panos Tsakiropoulos, Guildford, United Kingdom

[73] Assignee: The Secretary of State for Defence in her Britannic Majesty's Government of the United Kingdom of Great Britain & Northern Ireland of Defence Evaluation and Research Agency, United Kingdom

[21] Appl. No.: 08/776,668

[22] PCT Filed: Aug. 1, 1995

[86] PCT No.: PCT/GB95/01849

§ 371 Date: May 21, 1997

§ 102(e) Date: May 21, 1997

[87] PCT Pub. No.: WO96/04408

PCT Pub. Date: Feb. 15, 1996

[30]     Foreign Application Priority Data

Aug. 1, 1994  [GB]  United Kingdom ................... 9415527

[51] Int. Cl.$^6$ ............................ B32B 9/00; B32B 15/14; C22C 1/09

[52] U.S. Cl. .................. 428/366; 428/373; 428/374; 428/379; 428/389; 428/397; 428/605; 428/607; 428/368; 428/387; 428/367; 428/388

[58] Field of Search ...................................... 428/369, 373, 428/374, 379, 389, 397, 605, 607, 366, 368, 367, 387, 388

[56]           References Cited

U.S. PATENT DOCUMENTS 4,853,294  8/1989  Everett et al. .
5,162,159  11/1992  Tenhover et al. .
5,273,709  12/1993  Halverson et al. .
5,354,615  10/1994  Tenhover et al. .

FOREIGN PATENT DOCUMENTS

A2556876  6/1985  France .

Primary Examiner—Richard Weisberger
Attorney, Agent, or Firm—Nixon & Vanderhye

[57]           ABSTRACT

A metal matrix composite material made of a fiber reinforcement having a coating of gadolinium and gadolinium boride, preferably as discrete layers, each having a thickness of 1 to 6 microns. This composite is made by coating reinforcing fibers with gadolinium using a deposition technique, further coating the fibers with gadolinium boride by a deposition technique and then consolidating the coated fibers into a metal matrix to form the metal matrix composite.

14 Claims, 1 Drawing Sheet

COMPOSITE MATERIALS

The present invention relates to matrix composite materials and more particularly relates to a coating for the materials.

It is known to prepare composites comprising a fiber reinforcement in a metal matrix. The presence of fibers reduces or prevents the propagation of cracks in the material and is an effective method of increasing the elastic strength and toughness of a material. The resultant materials are characterised by high strength and stiffness and light weight which make them useful for fabrication of aircraft structures, deep sea pressure vessels and other like applications. Thus, continuous silicon carbide fibre reinforced metal matrix composite materials offer advantages over conventional monolithic materials.

However there is a need to fabricate a protective coating or layer for the fiber to reduce or prevent interfacial chemical or other types of microstructural degradation. The present invention relates to an improved coating for silicon carbide fibres in a metal matrix composite material.

Thus according to the present invention there is provided a matrix composite material comprising a fibre reinforcement, the fiber reinforcement having a coating comprising gadolinium and gadolinium boride.

It is desirable that the fiber coating is capable of accommodating the strains imposed between the fiber and the matrix caused by the differences in coefficient of thermal expansion and hence reduce the risk of matrix cracking or coating fracture. Also the coating is desirably capable of preventing or reducing the transport of reactant material from the matrix to the fiber thereby avoiding chemical degradation of the fiber.

The fiber reinforcement may be any particulate, whisker, laminate, short or continuous fiber but is preferably ceramic and is most preferably silicon carbide. The matrix of the composite may be any metal containing material but is preferably a metal alloy, an intermetallic compound, or a ceramic. The preferred metal is titanium and may be in the form of a titanium alloy, an intermetallic compound such as titanium aluminide, TiAl or $Ti_3Al$, or a ceramic such as an oxide, carbide, boride or nitride. Other suitable materials include nickel containing materials. Intermetallic compounds tend to have good high temperature properties but are less damage tolerant, e.g. may be vulnerable to cracking, and thus are particularly suitable for the coating of the present invention.

The coating preferably comprises a gadolinium layer having a thickness of 1 to 6 microns and a gadolinium boride layer having a thickness of 1 to 6 microns. The gadolinium boride has a composition $GdB_x$ where x is in the range 2 to 6. In the case of titanium based metal matrix composites, the gadolinium layer is preferably formed adjacent to the fiber.

The coating can be applied to the fibers by a variety of known techniques such as electrodeposition, sputtering etc but the preferred technique is by use of electron beam deposition.

The invention also includes a method of fabricating a matrix composite material comprising the steps of (a) coating SiC fibers with gadolinium by use of a deposition technique (b) further coating the fibers with gadolinium boride by use of a deposition technique and (c) consolidating the coated fibers into a matrix by means of a suitable consolidation technique to form the matrix composite.

The deposition technique may be by use of electron beam deposition. The consolidation technique may comprise hot pressing. It is preferred that for titanium based matrix composites the first coating on the SiC fiber is gadolinium.

The invention will now be described by way of example only and with reference to the accompanying drawing.

The FIGURE shows a diagrammatic drawing of the experimental arrangement for coating SiC fiber with a duplex layer of gadolinium and gadolinium boride.

The fiber 1 were mounted in a cylindrical array on a rotatable fibre carrier 2. The carrier was located above a Temescal CV14 electron-beam (EB) heated double evaporation source 3 and was rotated at 300 r.p.m. The gadolinium source 7 incorporated a rod-feed mechanism 4 to supply gadolinium to replenish the evaporation pool/crucible 5.

The silicon carbide fiber used were BP Sigma fibres of 100 microns diameter and they were coated with a layer of gadolinium followed by a layer of gadolinium boride $GdB_3$. The coatings were applied by physical vapor deposition using electron beam evaporation using the Temescal evaporator 3. Separate sources were used for the gadolinium and the boron. Shutters (not shown) were used to prevent gadolinium or boron reaching the fiber during condition adjustment times until substantially steady state conditions were attained.

During use, the gadolinium was contained in crucible 5. The power was increased up to 3 KW at a rate of 1 KW/min. The shutters were then opened for 50 seconds. After this time there was a two micron coating of gadolinium on the fiber 1. The shutters were then closed.

The power setting for crucible 5 was reduced to 0.9 KW and the power for crucible 6 containing the boron was increased to 1.3 KW at a rate of 0.05 KW/min. The shutters were then opened for four minutes. After this time there was a one micron coating of $GdB_3$ on top of the gadolinium layer.

The resultant coated fibers may then be used in a conventional fabrication technique for producing a matrix composite material.

We claim:

1. A matrix composite material comprising a fiber reinforcement wherein the fiber reinforcement has a coating comprising gadolinium and gadolinium boride.

2. The material according to claim 1 in which the coating comprises a gadolinium layer and a gadolinium boride layer.

3. The material according to claim 1 in which the gadolinium layer has a thickness of 1 to 6 microns and the gadolinium boride layer has a thickness of 1 to 6 microns.

4. The material according to claim 1 in which the gadolinium boride has a composition $GdB_x$ where x is in the range 2 to 6.

5. The material according to claim 1 in which the fiber reinforcement is ceramic.

6. The material according to claim 5 in which the fiber reinforcement is silicon carbide.

7. The material according to claim 1 in which the matrix of the composite is a metal alloy, an intermetallic compound, or a ceramic.

8. The material according to claim 1 in which the matrix of the composite contains titanium.

9. The material according to claim 8 in which the gadolinium is formed adjacent the fiber.

10. The material according to claim 1 in which the matrix of the composite contains nickel.

11. A method of fabricating a matrix composite material comprising the steps of:

(a) coating SiC fibers with gadolinium, (b) further coating the fibers with gadolinium boride, and (c) consolidating the coated fibers into a matrix.

12. The method according to claim 11 in which the gadolinium is applied by electron beam deposition.

13. The method according to claim 1 in which the gadolinium boride is applied by electron beam deposition.

14. The method according to claim 1, in which consolidating the coated fibers into a matrix in step (c) is achieved by hot pressing.

* * * * *